(12) United States Patent
Liu et al.

(10) Patent No.: US 11,720,001 B2
(45) Date of Patent: Aug. 8, 2023

(54) DRIVING VIDEO RECORDER FOR AUTOMOTIVE AND HAVING A FAN

(71) Applicant: LUMILEDS LLC, San Jose, CA (US)

(72) Inventors: Shichun Liu, Shanghai (CN); Chao Shang, Shanghai (CN); Pei Yang, Shanghai (CN); Xuejun Zhang, Shanghai (CN); Huihua Chen, Shanghai (CN); Chuanwen Jiang, Shanghai (CN)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/754,228

(22) PCT Filed: Oct. 8, 2018

(86) PCT No.: PCT/EP2018/077291
§ 371 (c)(1),
(2) Date: Apr. 7, 2020

(87) PCT Pub. No.: WO2019/072750
PCT Pub. Date: Apr. 18, 2019

(65) Prior Publication Data
US 2021/0200068 A1 Jul. 1, 2021

(30) Foreign Application Priority Data

Oct. 13, 2017 (WO) ................ PCT/CN2017/106018
Nov. 8, 2017 (EP) ..................................... 17200538

(51) Int. Cl.
*G08B 13/196* (2006.01)
*G03B 17/55* (2021.01)
(Continued)

(52) U.S. Cl.
CPC ............. *G03B 17/55* (2013.01); *G02B 13/06* (2013.01); *H04N 5/76* (2013.01); *H04N 23/45* (2023.01);
(Continued)

(58) Field of Classification Search
CPC ........ G03B 17/55; G03B 19/07; G03B 17/17; G03B 35/08; H04N 13/239; H04N 5/2252;
(Continued)

(56) References Cited

U.S. PATENT DOCUMENTS 6,850,025 B1 * 2/2005 Paolantonio ..... G08B 13/19632
318/685
2007/0024743 A1 * 2/2007 Hida ................ G08B 13/19619
348/E5.026

(Continued)

FOREIGN PATENT DOCUMENTS

CN  201937729 U  *  8/2011
CN  201937729 U     8/2011
(Continued)

OTHER PUBLICATIONS

European Search Report corresponding to EP 17200538, dated Apr. 11, 2018, 2 pages.
(Continued)

*Primary Examiner* — Patrick E Demosky

(57) ABSTRACT

The present disclosure provides a driving video recorder for an automotive, which includes: a housing having a side wall, a top wall with an air outlet, and a bottom wall with an air inlet; a first electric fan arranged on the bottom wall above the air inlet and in a vertical middle plane of the housing for directing outside air into the housing; two sets of lenses for image capturing arranged at the side wall and positioned symmetrically on both sides of the vertical middle plane of (Continued)

the housing; and heat generating electrical components provided within the housing. The driving video recorder according to the present disclosure has a symmetrically distributed lens structure ensuring system stability, reliability, and enhanced functionality.

16 Claims, 4 Drawing Sheets

(51) Int. Cl.
*G02B 13/06* (2006.01)
*H04N 5/76* (2006.01)
*H05K 7/20* (2006.01)
*H04N 23/45* (2023.01)
*H04N 23/51* (2023.01)
*H04N 23/52* (2023.01)

(52) U.S. Cl.
CPC ............. *H04N 23/51* (2023.01); *H04N 23/52* (2023.01); *H05K 7/2039* (2013.01); *H05K 7/20136* (2013.01)

(58) Field of Classification Search
CPC .... H04N 5/22521; H04N 5/2258; H04N 5/76; G02B 13/06; H05K 7/20136; H05K 7/2039
See application file for complete search history.

(56) References Cited

U.S. PATENT DOCUMENTS

| | | | | |
|---|---|---|---|---|
| 2009/0242186 | A1* | 10/2009 | Koshiyama | G06F 1/181 165/288 |
| 2013/0044189 | A1* | 2/2013 | Irikiin | G03B 17/55 348/47 |
| 2014/0055671 | A1* | 2/2014 | Kawamura | H04N 5/2252 348/374 |
| 2016/0295096 | A1* | 10/2016 | Lever | H01Q 1/22 |
| 2016/0350792 | A1 | 12/2016 | Donaldson | |
| 2017/0195533 | A1 | 7/2017 | Seo et al. | |
| 2017/0305360 | A1* | 10/2017 | Zajac | G01C 3/08 |
| 2019/0384313 | A1* | 12/2019 | Toth | H04N 5/2252 |

FOREIGN PATENT DOCUMENTS

| | | | | |
|---|---|---|---|---|
| CN | 202257004 U | | 5/2012 | |
| CN | 103026699 A | | 4/2013 | |
| CN | 105812640 A | | 7/2016 | |
| CN | 206411402 U | | 8/2017 | |
| CN | 206433066 U | * | 8/2017 | |
| CN | 206433066 U | | 8/2017 | |
| EP | 1748640 A1 | | 1/2007 | |
| EP | 3457208 A1 | * | 3/2019 | ............. G03B 15/02 |
| EP | 3457208 A1 | | 3/2019 | |
| JP | 2015-185852 A | | 10/2015 | |
| KR | 20140000824 A | | 1/2014 | |
| WO | 2012/082127 A1 | | 6/2012 | |
| WO | 2019/072750 A1 | | 4/2018 | |

OTHER PUBLICATIONS

Notification of Transmittal of the International Search Report and the Written Opinion of the International Search Authority, or the Declaration corresponding to PCT/EP2018/077291, dated Dec. 3, 2018,14 pages.

Abstract only CN206460244U, Applicants: Xaircraft Co Ltd, He et al., "Obstacle-avoiding device and have its umanned aerial vehicle", Sep. 1, 2017, 1 page.

The extended European Search Report corresponding to EP application No. 17200538.1 dated Apr. 20, 2018, 7 pages.

* cited by examiner

SECTION A-A

DRIVING VIDEO RECORDER FOR AUTOMOTIVE AND HAVING A FAN

CROSS-REFERENCE TO RELATED APPLICATIONS

The present application is a § 371 application of International Patent Application No. PCT/EP2018/077291 filed on Oct. 8, 2018, which claims benefit of priority to International Patent Application No. PCT/CN2017/106018 filed Oct. 13, 2017 and to European Patent Application No. 17200538.1 filed on Nov. 8, 2017, each of which is incorporated herein by reference in its entirety.

BACKGROUND OF THE DISCLOSURE

1. Field of the Disclosure

The present disclosure relates to a field of a video recorder, specifically to a driving video recorder for an automotive.

2. Description of the Prior Art

Driving video recorders have become increasingly popular in our daily life. In order to make a driving video recorder small and compact, components of the driving video recorder, such as a digital signal processor (DSP) for processing video signals, a sensor (e.g. a CMOS sensor), a memory component and a WIFI module, are usually integrated within a very limited space. Because the existing driving video recorders typically adopt a natural convection cooling system, heat generated from these components is hard to radiate outwards. The thermal aggregation effect usually results in sorts of failures of the driving video recorder, thereby deteriorating the stability and reliability of the driving video recorder.

As a further issue, the existing driving video recorders for an automotive usually have only one lens or only one set of lenses for image capturing arranged at one side thereof, which causes the driving video recorder to tilt easily and have a limited field of view only.

Therefore, it is necessary to provide an improved driving video recorder at least partially alleviating above problems.

SUMMARY OF THE DISCLOSURE

The object of the present disclosure is to provide a driving video recorder for an automotive improving on one or more of system stability, reliability, and functionality.

In order to achieve the above-mentioned object, the present disclosure provides a driving video recorder for an automotive, which includes: a housing having a side wall, a top wall with an air outlet, and a bottom wall with an air inlet; a first electric fan arranged on the bottom wall above the air inlet and in a vertical middle plane of the housing for directing outside air into the housing; two sets of lenses for image capturing arranged at the side wall and positioned symmetrically on both sides of the vertical middle plane of the housing; and heat generating electrical components provided within the housing.

According to the disclosure, the heat generating electrical components are symmetrically distributed on both sides of the vertical middle plane thereby providing an optimized spatial relationship of the heat generating components to the cooling chimney.

On the one hand, since the driving video recorder has an active-cooling system, that is, the first electric fan is arranged on the bottom wall above the air inlet and in a vertical middle plane of the housing for directing outside air into the housing, compared with a conventional natural convection cooling system, heat generated from the heat generating components is easily forced out from the housing of the driving video recorder. The system temperature is therefore effectively reduced to a lower temperature and the system performance becomes better, thereby improving the stability and reliability. On the other hand, the driving video recorder for an automotive according to the disclosure has two sets of lenses for image capturing arranged at the side wall and positioned symmetrically on both sides of the vertical middle plane of the housing, compared with an existing driving video recorder having only one lens or only one set of lenses for image capturing arranged at one side thereof, the driving video recorder according to the present disclosure is not easy to tilt and provides a wider field of view.

According to an example of the disclosure, a second electric fan is arranged at the top wall below the air outlet for forcing hot air from the heat generating electrical components out of the housing. This second electric fan together with the first electric fan collaboratively forms a chimney effect, which further improves the system cooling effectiveness.

According to an example of the disclosure, the second electric fan is aligned with the first electric fan along the vertical middle plane of the housing.

According to an example of the disclosure, the housing is a sphere-shaped housing.

According to an example of the disclosure, the two lenses are panoramic fisheye lenses thereby providing an even all around 360° panoramic view.

According to an example of the disclosure, the heat generating electrical components are sensors, one or more digital signal processors, and memory components.

According to an example of the disclosure, at least one of the heat generating electrical components is provided with a heat sink thereby allowing an enhanced cooling of critical components, i.e., components generating strong heat or being particularly sensitive to overheating.

According to an example of the disclosure, the heat sink is provided with fins for radiating heat.

According to an example of the disclosure, the fins extend in a direction perpendicular to the vertical middle plane providing an optimized heat transfer from the heat generating components via the heat sink to the cooling chimney.

According to an example of the disclosure, the housing with the side wall, the top wall and the bottom wall is integrally injection molded.

According to another example of the disclosure, the side wall, the top wall and the bottom wall of the housing are formed separately and then assembled into the housing.

According to still another example of the disclosure, the driving video recorder further comprises a WiFi module.

BRIEF DESCRIPTION OF THE DRAWINGS

Specific implementations of a driving video recorder for an automotive of the present disclosure will be exemplarily illustrated below with reference to the figures. In addition, it should be noted that the illustration does not limit the present disclosure in any manner.

In these figures.

DETAILED DESCRIPTION OF THE PRESENT DISCLOSURE

Figure 1:
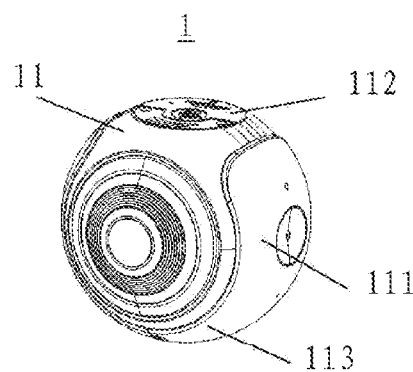
FIG. 1 is a schematic isometric view of a driving video recorder for an automotive according to one embodiment of the present disclosure.
Figure 2:
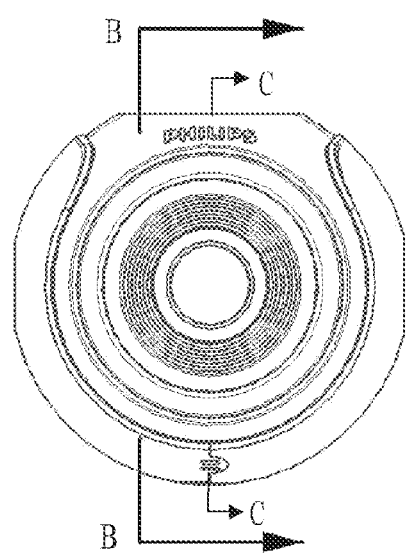
FIG. 2 is an enlarged front view of FIG. 1.

As shown in FIGS. 1-9, according to one embodiment of the present disclosure, a driving video recorder 1 for an automotive is provided. The driving video recorder 1 includes: a housing 11 having a side wall 111, a top wall 112 with an air outlet 1121, and a bottom wall 113 with an air inlet 1131; a first electric fan 12 arranged on the bottom wall 113 above the air inlet 1131 and in a vertical middle plane 6 of the housing 11 for directing outside air into the housing 11; two sets of lenses 13 for image capturing arranged at the side wall 111 and positioned symmetrically on both sides of the vertical middle plane 6 of the housing 11; and heat generating electrical components 14 provided within the housing 11.

According to one aspect of the present disclosure, the housing 11 is a sphere-shaped housing. The housing 11 with the side wall 111, the top wall 112 and the bottom wall 113 is integrally injection molded; or otherwise, the side wall 111, the top wall 112 and the bottom wall 113 of the housing 11 are formed separately and then assembled into the housing 11.

According to one aspect of the present disclosure, the driving video recorder 1 for the automotive is also provided with a second electric fan 15, which is arranged at the top wall 112 below the air outlet 1121 for forcing hot air from the heat generating electrical components 14 out of the housing 11. This second electric fan 15 together with the first electric fan 12 collaboratively forms a chimney effect to control the air flow from bottom to up to form a chimney effect, which further improves the system cooling effectiveness.

Preferably, the second electric fan 15 is aligned with the first electric fan 12 along the vertical middle plane 6 of the housing 11 to easily control the air flow from bottom to top along the heat generating electrical components 14.

Preferably, the two sets of lenses 13 are panoramic fisheye lenses for capturing panoramic video images. The two sets of lenses 13 may be oppositely arranged at the side wall 111. The two sets of lenses 13 have an optical axis 7 perpendicular to the vertical middle plane 6.

According to one aspect of the present disclosure, the heat generating electrical components 14 are symmetrically distributed on both sides of the vertical middle plane 6. Such arrangement has the advantages of rendering the whole driving video recorder 1 upright and easily balanced and not easy to tilt. As well it optimizes the flow of cooling air within the cooling chimney along the heat generating electrical components 14. The heat generating electrical components 14, typically, will be of various kinds. They may e.g. be selected from one or more of the following components: (CMOS) sensors 141, digital signal processors 142, and memory components 143.

Whereas the heat generating electrical components 14 of some of these kinds, as e.g. the CMOS sensors 141, will be paired with the lenses 13, i.e., will be present in an even number, there might also be kinds occurring in an uneven number only. There might e.g. be only a single mass memory component or a single communication module. Accordingly, when in the above referring to a symmetrical distribution of the heat generating electrical components 14 with respect to the vertical middle plane 6, such terminology, besides allocating the component types occurring in even numbers in equal numbers on both sides of the vertical middle plane 6, such symmetrical distribution in general shall mean any distribution of the heat generating electrical components 14 to the two sides of the vertical middle plane 6 resulting in the amount of heat generated on each side of the vertical middle plane 6 to be about the same as such amount generated on the other side of such vertical middle plane 6. I.e., in other words, such symmetrical distribution of the heat generating electrical components 14 refers in general to a symmetrical distribution of the heat generated.

Preferably, at least one of the heat generating electrical components 14 is provided with a heat sink 144, and the heat sink 144 preferably is provided with fins for radiating heat effectively. Optionally, the fins extend in a direction perpendicular to the vertical middle plane 6 for enlarging a contact area with the cooling air.

Optionally, the driving video recorder 1 further includes: a WiFi module 145 allowing for WiFi communication and enabling e.g. a smart phone control; and a PCB 150 for integrating and coupling electronics.

Figures 3, 4:
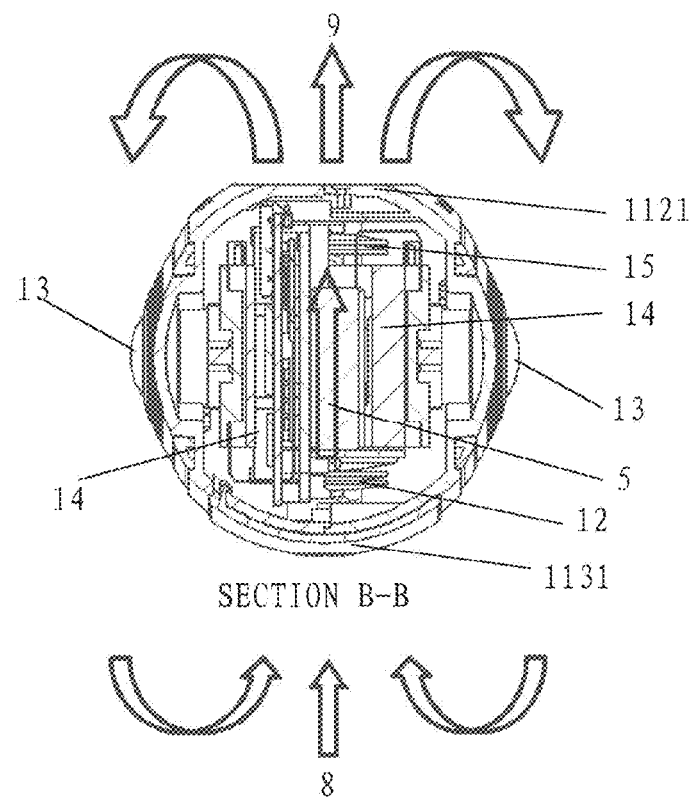
FIG. 3 is a schematic sectional view of FIG. 2 along line B-B showing details of air flow direction.
FIG. 4 is a schematic sectional view of FIG. 2 along line C-C with a housing of the driving video recorder omitted to show details of an inner structure of the driving video recorder.
Figure 5:
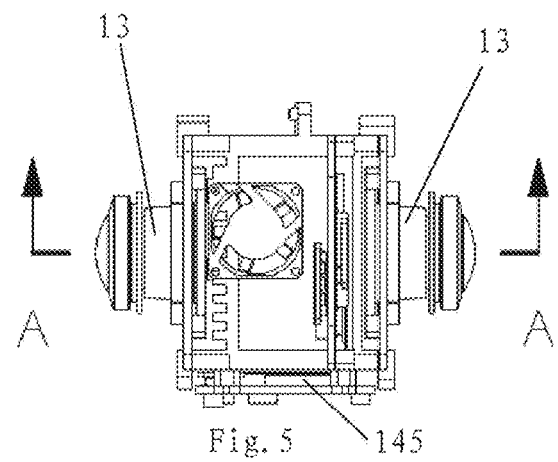
FIGS. 5-6 are bottom view and top view of FIG. 4, respectively.
Figure 6:
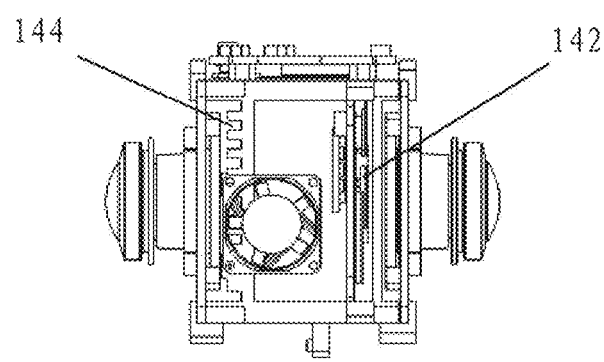
Figure 7:
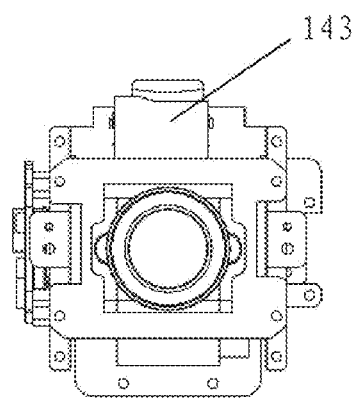
FIGS. 7-8 are left view and right view of FIG. 4, respectively.
Figure 8:
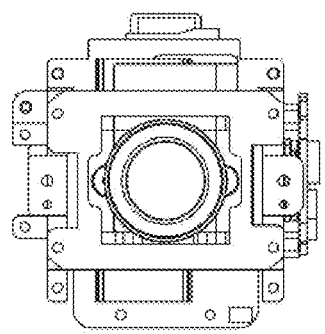
Figure 9:
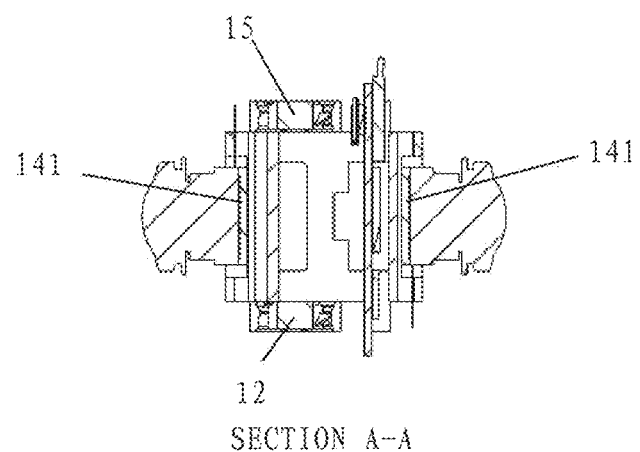
FIG. 9 is a sectional view of FIG. 5 along line A-A.

In operation, the driving video recorder 1 is suspended or supported in the automotive and is activated with the startup of the automotive. The two sets of lenses 13, oppositely arranged at the side wall 111, start to capture images while the first electric fan 12 and the second electric fan 15 start to turn to force the heat generated from the heat generating electrical components 14 outwards. Referring to FIG. 4, arrow 8 shows the inflow direction of the cool air, arrow 9 shows the outflow direction of the hot air, and arrow 5 shows the flow direction of the cooling air in the housing 11. In use, the cooling air flows from the arrow 8 to the arrow 9 via the arrow 5 in sequence.

A material of the housing 11 may be PMMA (acrylic), PC (polycarbonate) or ABS (acrylonitrile butadiene styrene).

Compared with the prior art, on the one hand, since the driving video recorder 1 of the present disclosure has an active-cooling system, that is, the first electric fan 12 is arranged on the bottom wall 113 above the air inlet 1131 and in the vertical middle plane 6 of the housing 11 for directing outside air into the housing 11, compared with a conventional natural convection cooling system, heat generated from the heat generating components 14 is easily forced out from the housing 11 of the driving video recorder 1. The system temperature is therefore effectively reduced to a lower temperature and the system performance becomes better, thereby improving the stability and reliability. On the other hand, the driving video recorder 1 for an automotive according to the disclosure has two sets of lenses 13 for image capturing arranged at the side wall 111 and positioned symmetrically on both sides of the vertical middle plane 6 of the housing 11, compared with an existing driving video recorder having only one lens or only one set of lenses for image capturing arranged at one side thereof, the driving video recorder 1 according to the present disclosure is not easy to tilt and has wider field of view.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, number, and arrangement of parts within the principles of the disclosure to the full extent indicated by the broad general meaning of the terms in which the appended claims are expressed.

It should be noted that the abovementioned embodiments illustrate rather than limit the disclosure and that those skilled in the art would be able to design alternative embodiments without departing from the scope of the appended claims.

In the claims, the word "comprising" does not exclude the presence of elements or steps not listed in a claim or in the description. The word "a" or "an" preceding an element does not exclude the presence of a plurality of such elements. In the apparatus claims enumerating several units, several of these units can be embodied by one and the same item of hardware or software. The usage of the words first, second and third, et cetera, does not indicate any ordering. These words are to be interpreted as names.

Unless otherwise defined, all the technology and scientific terms used in the present description have the same meaning with those commonly understood by the skilled in the art where the present disclosure belongs to.

LIST OF REFERENCE SIGNS 1 driving video recorder
5 arrow showing air flow direction within housing
6 vertical middle plane
7 optical axis of lenses
8 arrow showing direction of inflow
9 arrow showing direction of outflow
11 housing of driving video recorder
12 first electric fan
13 lenses
14 heat generating electrical components
15 second electric fan
111 housing side wall
112 housing top wall
113 housing bottom wall
141 (CMOS) sensors
142 digital signal processor(s)
143 memory component(s)
144 heat sink
145 WiFi module
150 PCB
1121 air outlet in housing top wall
1131 air inlet in housing bottom wall

The invention claimed is:

1. A driving video recorder for an automotive, comprising:
   a housing having a top wall with an air outlet, a bottom wall with an air inlet, and a side wall connecting the top wall with the bottom wall;
   a first electric fan arranged on the bottom wall above the air inlet and in a vertical middle plane of the housing for directing outside air into the housing;
   two sets of lenses for image capturing arranged at the side wall, each of the two sets of lenses positioned entirely and symmetrically on opposing sides of the vertical middle plane of the housing to face opposite directions and share an optical axis; and
   heat generating electrical components provided within the housing, the heat generating electrical components being symmetrically distributed on both sides of the vertical middle plane.

2. The driving video recorder according to claim 1, wherein a second electric fan is arranged at the top wall below the air outlet for forcing hot air from the heat generating electrical components out of the housing.

3. The driving video recorder according to claim 2, wherein the second electric fan is aligned with the first electric fan along the vertical middle plane of the housing.

4. The driving video recorder according to claim 1, wherein the housing is a sphere-shaped housing.

5. The driving video recorder according to claim 1, wherein the two lenses are panoramic fisheye lenses.

6. The driving video recorder according to claim 1, wherein the heat generating electrical components are sensors, one or more digital signal processors, and memory components.

7. The driving video recorder according to claim 1, wherein at least one of the heat generating electrical components is provided with a heat sink.

8. The driving video recorder according to claim 7, wherein the heat sink is provided with fins for radiating heat.

9. The driving video recorder according to claim 8, wherein the fins extend in a direction perpendicular to the vertical middle plane.

10. The driving video recorder according to claim 1, wherein the housing with the side wall, the top wall and the bottom wall is integrally injection molded.

11. The driving video recorder according to claim 1, wherein the side wall, the top wall and the bottom wall of the housing are formed separately and then assembled into the housing.

12. The driving video recorder according to claim 1, further comprising a WiFi module.

13. The driving video recorder according to claim 1, wherein the different directions of the two sets of lenses face are opposite directions.

14. The driving video recorder according to claim 1, wherein the optical axes of the two sets of lenses coincide.

15. The driving video recorder according to claim 1, wherein at least one of the two lenses has an optical axis perpendicular to and intersecting the vertical middle plane.

16. The driving video recorder according to claim 2, wherein the first electric fan and the second electric fan are arranged to blow air in a same direction.

\* \* \* \* \*